United States Patent [19]

Nippert

[11] 4,149,310
[45] Apr. 17, 1979

[54] METHOD OF MAKING A HEAT SINK MOUNTING

[75] Inventor: Russell A. Nippert, Delaware, Ohio

[73] Assignee: The Nippert Company, Delaware, Ohio

[21] Appl. No.: 890,300

[22] Filed: Mar. 27, 1978

[51] Int. Cl.² .................. H01R 9/00; H01R 43/00
[52] U.S. Cl. ............................ 29/630 R; 29/445; 29/581; 29/591; 228/155; 228/179; 174/52 H; 357/81
[58] Field of Search .............. 29/630 R, 445, 581, 29/592 R; 174/52 H; 357/81; 228/155, 179

[56] References Cited

U.S. PATENT DOCUMENTS

| 3,197,843 | 8/1965 | Nippert | 228/155 X |
| 3,199,000 | 8/1965 | Nippert | 174/52 H X |
| 3,279,039 | 10/1966 | Nippert | 228/155 X |
| 3,348,297 | 10/1967 | Dijkmeijer | 228/155 |
| 4,124,935 | 11/1978 | Sato | 29/630 R |

Primary Examiner—Charlie T. Moon

Attorney, Agent, or Firm—Biebel, French & Nauman

[57] ABSTRACT

A method of making a semi-conductor heat sink mounting includes two extrusion steps. Initially, a substantially cylindrical copper billet having an upper cylindrical locating portion of reduced diameter is formed. A steel ring is then brazed to the copper billet such that it surrounds the locating portion. The copper billet and the steel ring are then extruded to form a sink body portion, a pedestal portion extending upwardly from said body portion defining a disc receiving recess therein, and a resistance welding ridge surround the pedestal portion. A molybdenum disc is brazed into the disc receiving recess. A stem is then extruded downwardly from the body portion of the heat sink mounting as a substantially evenly distributed downward force is applied to the heat sink body portion, the pedestal portion and the molybdenum disc. This evenly distributed downward force prevents structural failure of the molybdenum disc by maintaining the disc in compression while the stem portion and the body portion of the heat sink mounting are worked to a full hard state.

5 Claims, 9 Drawing Figures

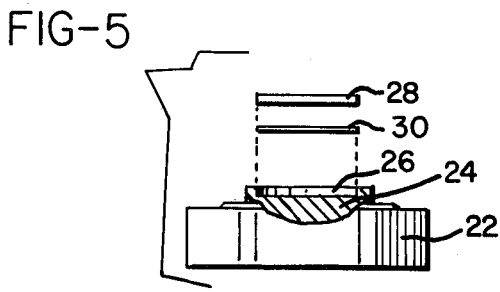
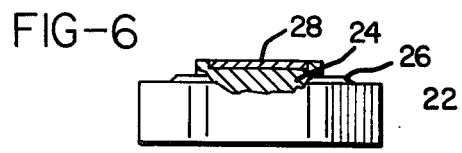
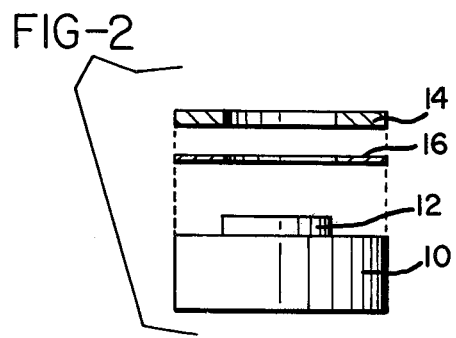
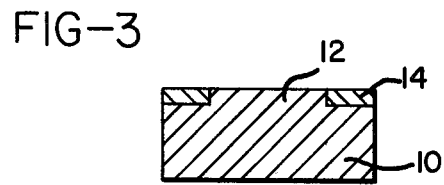
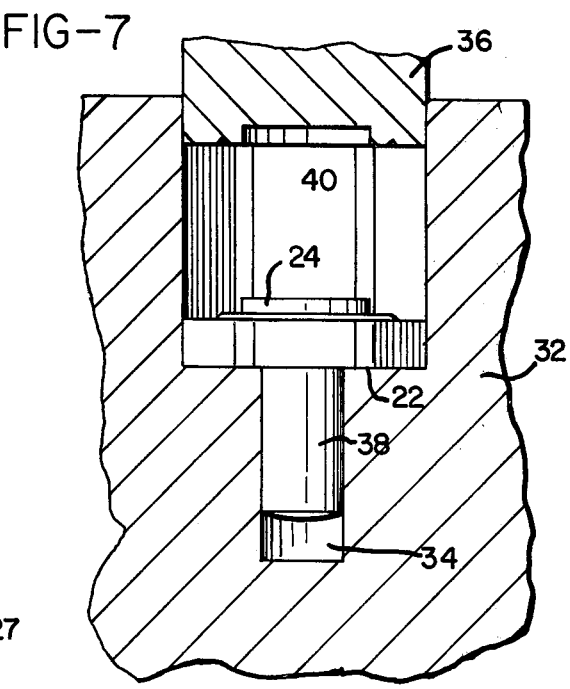
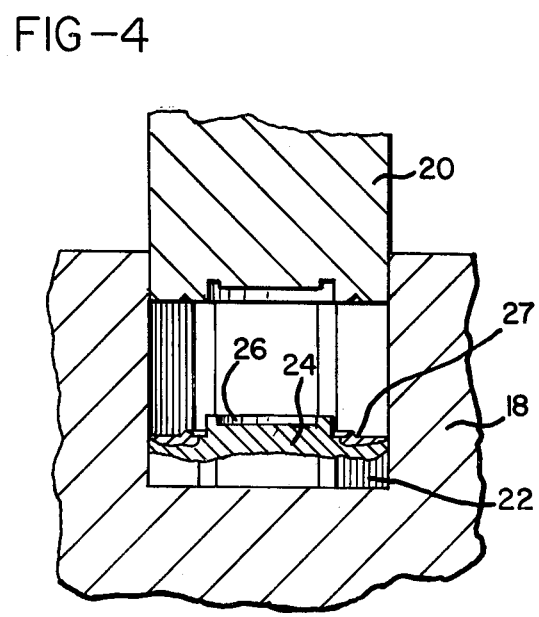
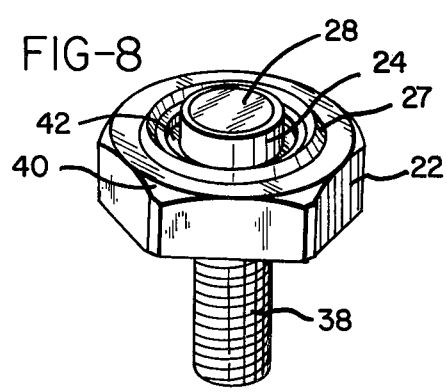

METHOD OF MAKING A HEAT SINK MOUNTING

BACKGROUND OF THE INVENTION

The present invention relates to a semi-conductor mounting, and, more particularly to an extruded semiconductor heat sink mounting formed of copper which incorporates a molybdenum disc.

Mounting arrangements for mounting semi-conductors have in the past included a copper mounting having a body portion and a downwardly extending stem portion. Typically, the stem portion is threaded so that it may be screwed into a threaded opening in a heat sink structure which provides the necessary cooling during operation of the semi-conductor device. The semi-conductor, typically formed of silicon, is mounted on the body portion of the mounting or, alternatively, on an upwardly extending platform portion of the mounting.

Although a copper mounting provides a highly efficient cooling mechanism for the semi-conductor, the coefficient of thermal expansion of copper is approximately $9.6 \times 10^{-6}$ inches per °F. while the thermal coefficient of expansion of silicon is approximately $1.6 \times 10^{-6}$ inches per °F. If the silicon semi-conductor were to be mounted directly upon the copper material, it would be fractured as the copper expands during the normal thermal cycle experienced during its operation. In order to prevent such fracturing, molybdenum discs have been brazed to the copper mountings and the silicon semi-conductors mounted on the molybdenum discs. Molybdenum has a thermal coefficient of expansion which is intermediate that of copper and silicon, approximately $2.7 \times 10^{-6}$ inches per °F., and therefore the stronger molybdenum absorbs the stress created by the thermal expansion of the copper material and prevents the semi-conductor from being damaged.

One technique which has been used for manufacturing the semi-conductor heat sink mounting has been to extrude a mounting having a body portion, a pedestal portion, and a stem portion in a single extrusion step. The copper material from which the mounting is formed is work-hardened by the extrusion process such that a relatively hard condition is reached. In order to properly affix the molybdenum disc to the copper mounting, however, it is necessary to braze the molybdenum disc into place on the pedestal portion of the mounting. The high temperature required for this brazing operation results in completely annealing the mounting, unless expensive heat treatable coppers or dispersion-hardened coppers are used. A heat sink mounting made of annealed copper is generally not acceptable because the soft annealed copper will distort as the mounting is threaded into the heat sink structure. This distortion may result in fracturing the silicon semi-conductor and the molybdenum disc upon which it is mounted.

One approach suggested by the prior art to the solution of this problem is shown in U.S. Pat. Nos. 3,197,843, issued Aug. 3, 1965, to Nippert; 3,199,000, issued Aug. 3, 1965, ti Nippert; and 3,279,039, issued Oct. 18, 1966, to Nippert, all being assigned to the assignee of the present invention. All of these patents suggest forming in a single extrusion step a work-hardened heat sink mounting for a semi-conductor after the molybdenum disc is brazed to a copper billet. The molybdenum disc and a steel weld ring are brazed onto the copper billet at the same time. A downward extending stem and an upward extending pedestal portion are then extruded from the billet simultaneously. The problem with this technique is that the molybdenum disc is subject to significant stress during the extrusion of the pedestal portion of the mounting. The disc tends to fracture or delaminate during this extrusion process because molybdenum is a very brittle material and will fracture when placed in tension. Illustrating this is the fact that Young's modulus for copper is $E=16 \times 10^6$ PSI, while Young's modulus for molybdenum is $E=50 \times 10^6$ PSI.

It is seen, therefore, that there is a need for a method of making a copper semi-conductor heat sink mounting having a stem portion, a body portion, and a pedestal portion including a molybdenum disc, in which the copper is work-hardened.

SUMMARY OF THE INVENTION

A method of making a semi-conductor heat sink mounting includes two extrusion steps. A cylindrical copper billet is formed and a weld ring brazed to the billet. A pedestal portion of the heat sink mounting is then extruded upwardly from the billet, while a body portion is formed from the weld ring and the billet. A molybdenum disc is brazed to the upper surface of the pedesal portion. A stem portion is then extruded downwardly from the body portion while a substantially evenly distributed force is maintained along the upper surface of the molybdenum disc. This force holds the disc in compression and thereby prevents structural failure of the disc as the body and stem portions of the heat sink mounting are worked sufficiently to harden the copper heat sink mounting.

Accordingly, it is an object of the present invention to provide a method of making a semi-conductor heat sink mounting having a body portion, a pedestal portion extending upwardly from said body portion, and a stem portion extending downwardly from said body portion, with a molybdenum disc brazed to the pedestal portion, in which the body portion, pedestal portion, and stem portion are formed of a work-hardened copper; to provide such a method of making a semi-conductor heat sink mounting in which the pedestal portion is formed in a first extrusion process and, after the molybdenum disc is brazed to the pedestal portion, the stem portion is formed in a second extrusion process; and to provide such a method of making a semi-conductor heat sink mounting in which a substantially uniformly distributed disc is maintained in compression during the second extrusion process as the stem portion is formed.

BRIEF DESCRIPTION OF THE DRAWINGS

FIG. 1A is a partial top view of a cylindrical billet used in the method of the present invention;

FIG. 1B is a front view of the cylindrical billet of FIG. 1A;

FIG. 2 is an exploded front view showing the cylindrical billet, a steel ring, and braze ring;

FIG. 3 is a sectional view taken through the center of the elements of FIG. 2 after brazing;

FIG. 4 is a view showing the pedestal portion and the body portion of the heat sink mounting with the die portions in section, after the initial extrusion process;

FIG. 5 is an exploded front view of a molybdenum disc, a braze ring, and the pedestal and body portions;

FIG. 6 is a front view of the elements of FIG. 5 after brazing;

FIG. 7 is a view of the mounting after the second extrusion process, showing the die portions in section; and FIG. 8 is a perspective view of the semi-conductor heat sink mounting made by the method of the present invention.

DETAILED DESCRIPTION OF THE PREFERRED EMBODIMENT

Reference is now made to FIGS. 1-8 which illustrate the method of the present invention for making a semi-conductor heat sink mounting. As shown in FIGS. 1A and 1B, a substantially cylindrical copper billet 10 is formed with a positive locating portion 12 of reduced diameter on its upper surface. Billet 10 may be formed by upsetting a copper rod which has been cut to the appropriate length.

Next, a steel weld ring 14 and a ring of brazing material 16 are placed onto the billet 10 such that the weld ring 14 surrounds the locating portion 12. These elements are then brazed together by heating them to approximately 1350° F. in a hydrogen atmosphere. This brazing process will anneal the copper, making it extremely soft.

FIG. 3 is a sectional view, taken along a diameter of the billet 10, showing the billet and steel weld ring 14 after brazing. The copper in billet 10 will at this point be substantially annealed. The brazed billet and ring combination of FIG. 3 is then placed in an extrusion die 18, as shown in FIG. 4. A mating die portion 20 is then moved downwardly to apply a substantial force to the weld ring 14 and billet 10 such that they are extruded to form a sink body portion 22, a pedestal portion 24, and a resistance welding ridge 27, which surrounds the pedestal portion 24. As shown in FIG. 4, welding ridge 27 has been extruded from the steel weld ring 14. The pedestal portion 24 is extruded upwardly through the weld ring 14 and defines a disc receiving recess 26. The periphery of the sink body may have a number of flat surfaces, such as the substantially hexagonal periphery shown, which will permit the completed heat sink mounting to be gripped by a wrench and screwed into a heat sink. After the extrusion process of FIG. 4, the copper material in the pedestal portion 24 and the body portion 22 will be work-hardened.

As shown in FIGS. 5 and 6, a molybdenum disc 28 and a disc of brazed material 30 are placed in the disc receiving recess 26 of the pedestal portion 24. The elements of FIG. 5 are then heated in a hydrogen atmosphere to approximately 1350° F., brazing them together and producing the unit illustrated in FIG. 6. This brazing operation will once again anneal the copper material in the pedestal and body portions.

The unit of FIG. 6 is now placed in a die 32 having a stem recess 34. Mating die portion 36 then applies a substantial downward force such that a stem portion 38 is extruded downwardly from the body portion 22 into recess 34. The face 40 of die portion 36 is configured to mate precisely with the upper surface contour of the assembly of FIG. 6. This results in a substantially evenly distributed downward force being applied to the sink body portion 22, the pedestal portion 24, and the molybdenum disc 28. There is, therefore, no extrusion movement of the material adjacent the face 40 of the die portion 36.

The copper in the body portion 22 and the stem portion 38 is worked substantially, however, to produce a work-hardened mounting. At the same time, a supporting pressure is maintained across the entire upper surface of the heat sink mounting by the die portion 36 such that the molybdenum disc will be held in compression and a structural failure of the disc thereby prevented. Since, as mentioned previously, molybdenum is extremely brittle, any movement of the molybdenum disc or adjacent copper might place the disc in tension and result in a fracture of the molybdenum.

The final semi-conductor heat sink mounting produced by this double extrusion process is shown in FIG. 8. Note that stem portion 38 has been threaded to provide for its attachment to a heat sink. A chamfered surface 40 and groove 42 have also been machined.

During the initial extrusion process illustrated in FIG. 4, material is displaced from the billet 10 to fill out the substantially hexagonal shape of the body portion 22. In producing one typical heat sink mounting, the increase in cross sectional area as the body portion of the heat sink mounting is formed from the billet 10 was approximately 11%. Approximately 8% of the volume of the billet 10 is extruded upwardly to form the pedestal portion 24. In the second extrusion step illustrated in FIG. 7, one typical heat sink mounting was formed in which the stem portion 38 of the mounting contained 24% of the total volume of the material of the mounting. In a heat sink having a slightly longer stem portion, 30% of the total volume of the sink was formed by the stem portion 38. The extrusion pressure required in the initial extrusion process of FIG. 4 was approximately 213,252 PSI while the pressure used in the second extrusion process of FIG. 7 was approximately 228,484 PSI.

Since the degree of working of the copper material in the second extrusion step shown in FIG. 7 is substantial, the copper material which was previously annealed in the brazing operation of FIG. 5 is once again work-hardened to a high hardness state. Hardness of heat sinks produced by the two-step extrusion process of the present invention has been checked throughout the heat sink and hardness readings ranging from $R_t30=66$ to $R_t30=60$ on the Rockwell superficial hardness scale have been found.

While the method herein described constitutes a preferred embodiment of the invention, it is to be understood that the invention is not limited to this precise method, and that changes may be made therein without departing from the scope of the invention.

I claim:

1. The method of making a semi-conductor heat sink mounting, comprising the steps of:

forming a substantially cylindrical copper billet having an upper cylindrical locating portion of reduced diameter, brazing a steel ring to said copper billet such that it surrounds said locating portion, extruding said copper billet and said steel ring to form a sink body portion, a pedestal portion extending upwardly from said body portion and defining a disc receiving recess therein, and a weld ridge surrounding said pedestal portion, brazing a molybdenum disc into said disc receiving recess, and extruding a stem downwardly from said body portion while applying a substantially evenly distributed downward force to said sink body portion, said pedestal portion, and said molybdenum disc, such that the copper in said body portion and said stem portion and said body portion are worked to a full hard condition while maintaining said molybdenum disc in compression to prevent structural failure thereof.

2. The method of making a heat sink mounting of claim 1 in which the step of extruding said copper billet and said steel ring to form a sink body portion includes the step of forming the periphery of said body portion into a substantially hexagonal shape.

3. The method of making an extruded heat sink mounting for heat dissipation of a semi-conductor device, said heat sink mounting including a body portion, a pedestal portion extending above said body portion and including a molybdenum disc mounted thereon, and a stem portion extending below said body portion, comprising the steps of:

forming a cylindrical copper billet having a positive locating portion on its upper surface, brazing a steel ring onto said cylindrical billet such that said ring surrounds said locator, extruding said billet upwardly through said ring to form a pedestal portion, defining a recess therein, as said billet and said ring are formed into a body portion, brazing a molybdenum disc into said recess, and extruding a stem portion from said body portion while maintaining a supporting pressure along said molybdenum disc, such that substantial material from said body portion is extruded into said stem portion and said body and said stem portion are work-hardened.

4. The method of making a semi-conductor heat sink mounting, comprising the steps of:

(a) form a cylindrical billet of copper, (b) brazing a weld ring to an upper end of said cylindrical billet, (c) extruding a pedestal portion upwardly from said billet while forming a body portion from said weld ring and said billet, (d) brazing a molybdenum disc to the upper surface of said pedestal portion, and (e) extruding a downwardly extending stem portion from said body portion while maintaining a substantially evenly distributed force along the upper surface of said molybdenum disc, such that said disc is held in compression and structural failure thereof prevented while working said body and stem portions of said heat sink mounting sufficiently to produce a hard heat sink.

5. Method of making a semi-conductor heat sink mounting having a body portion, a pedestal portion extending upwardly from said body portion, and a stem portion extending downwardly from said body portion, comprising the steps of:

forming a copper billet, brazing a steel ring to said copper billet, extruding said copper billet and said steel ring to form a body portion and an upwardly extending pedestal portion, brazing a molybdenum disc to said pedestal portion, applying a substantially uniformly distributed force across the top of said molybdenum disc, such that said disc is held in compression, and extruding a downwardly extending stem portion from said body portion while said uniformly distributed force is maintained on said molybdenum disc, such that said body portion and said stem portion of said heat sink are work-hardened while maintaining said molybdenum disc in compression to prevent structural failure thereof.

* * * * *